United States Patent [19]

Suyama et al.

[11] Patent Number: 5,777,492

[45] Date of Patent: Jul. 7, 1998

[54] ADDRESS TRANSITION DETECTOR CIRCUIT

[75] Inventors: Junichi Suyama; Kazukiyo Fukudome, both of Tokyo, Japan

[73] Assignee: Oki Electric Industry Co., Ltd., Tokyo, Japan

[21] Appl. No.: 664,546

[22] Filed: Jun. 17, 1996

[51] Int. Cl.$^6$ ................................................ H03K 5/19
[52] U.S. Cl. ..................... 327/18; 327/36; 327/176
[58] Field of Search ........................ 327/18, 36, 176

[56] References Cited

U.S. PATENT DOCUMENTS

| | | | |
|---|---|---|---|
| 5,329,188 | 7/1994 | Sikkink et al. | 327/18 |
| 5,566,129 | 10/1996 | Nakashima et al. | 327/36 |
| 5,625,604 | 4/1997 | Kim et al. | 327/176 |
| 5,638,016 | 6/1997 | Eitrheim | 327/175 |
| 5,646,565 | 7/1997 | Tukidate | 327/18 |

*Primary Examiner*—Margaret Rose Wambach
*Attorney, Agent, or Firm*—Rabin & Champagne, P.C.

[57] ABSTRACT

In an ATD circuit, a pulse width amplifier circuit is provided between a first circuit means and a second circuit means. The first circuit means generates a first output signal having a first pulse width in response to a change in external address signal and generates, when the external address signal becomes a first sawtooth signal, a second sawtooth output signal having a peak value smaller than that of the first sawtooth signal. The second circuit means receives therein the signal generated by the pulse width amplifier circuit and waveform-shapes the output signal so as to provide an ATD signal therefrom. The pulse width amplifier circuit amplifies a pulse width of the signal generated by the first circuit means. Further, the pulse width amplifier circuit generates a third output signal having a second pulse width corresponding to the first pulse width when the first output signal is received thereto and generates a fourth output signal having a third pulse width when the second output signal is received thereto.

9 Claims, 12 Drawing Sheets

5,777,492

1

ADDRESS TRANSITION DETECTOR CIRCUIT

BACKGROUND OF THE INVENTION

1. Field of the Invention

This invention relates to an address transition detector circuit (which will hereinafter be called "ATD circuit").

2. Description of the Related Art

Conventional ATD circuits have encountered difficulties in ensuring a predetermined pulse width of a signal generated therefrom, although the output signal will be described later in detail.

SUMMARY OF THE INVENTION

With the foregoing in view, it is therefore an object of the present invention to provide an ATD circuit capable of generating a stable ATD pulse therefrom.

According to one aspect of the present invention, for achieving the above object, there is provided an ATD circuit comprising:

(a) first circuit means (15 in FIG. 2) for generating a first output signal (ATDiB, FIG. 10F) having a first pulse width in response to a change in external address signal (AIN) and generating, when the external address signal (AIN) is brought to a first sawtooth signal, a second sawtooth output signal (ATDiB, FIG. 9F) having a peak value smaller than that of the first sawtooth signal;

(b) a pulse width amplifier circuit (21 in FIG. 3) for amplifying a pulse width of the signal generated by the first circuit means, the pulse width amplifier circuit generating a third output signal (ATDiBI in FIG. 10G) having a second pulse width corresponding to the first pulse width when the first output signal is provided thereto (ATDiB in FIG. 10F) and generating a fourth output signal (ATDiBI in FIG. 9J) having a third pulse width when the second output signal is provided thereto (ATDiB in FIG. 9F); and (c) second circuit means (17) for receiving therein the signal generated by the pulse width amplifier circuit (21) and waveform-shaping the output signal so as to provide an ATD signal therefrom.

Further, the present application discloses other various embodiments made to achieve the above object. These embodiments will be understood from the appended claims, the following description and the accompanying drawings.

BRIEF DESCRIPTION OF THE DRAWINGS

While the specification concludes with claims particularly pointing out and distinctly claiming the subject matter which is regarded as the invention, it is believed that the invention, the objects, features, and advantages thereof will be better understood from the following description taken in connection with the accompanying drawings in which:

2

Figure 1:
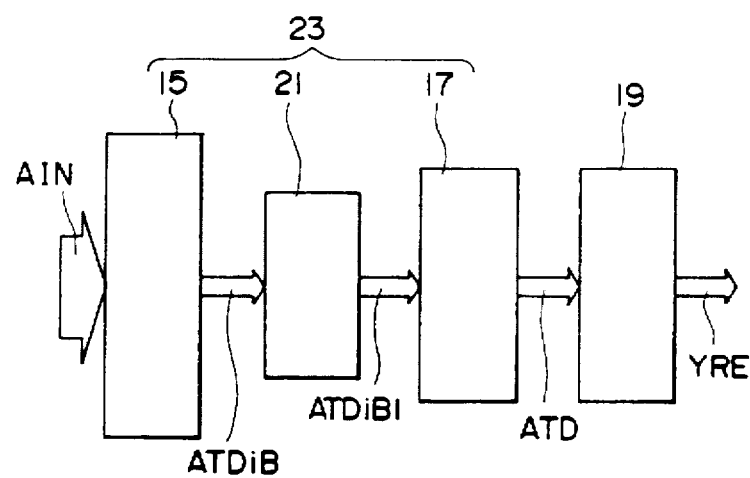
FIG. 1 is a block diagram of an ATD circuit showing a first embodiment of the present invention.
Figure 6:
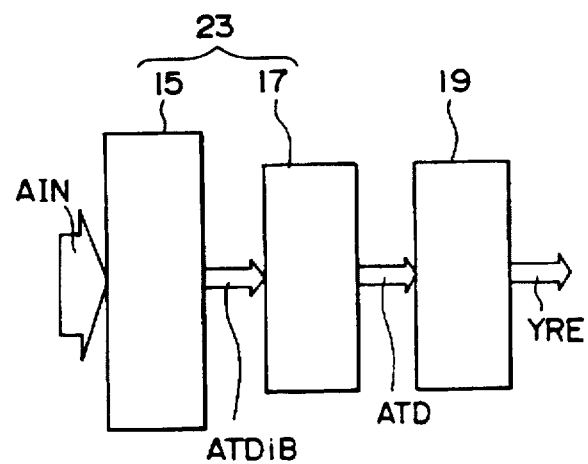
FIG. 6 is a block diagram illustrating an ATD circuit for comparison.
Figure 8:
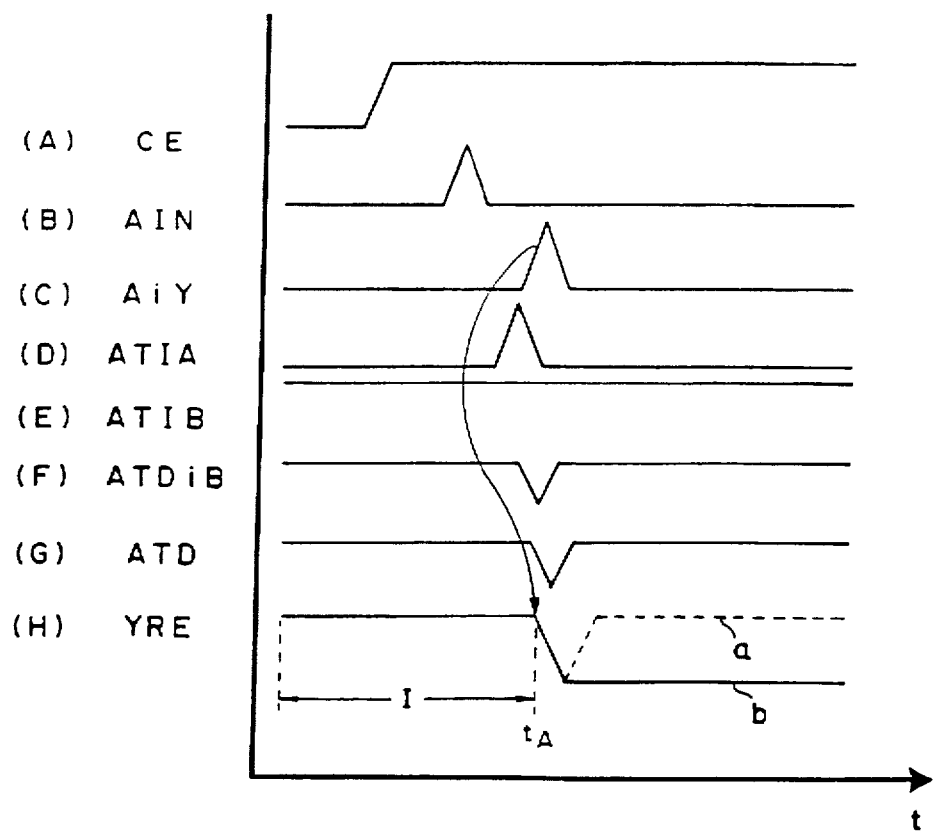
Figure 9:
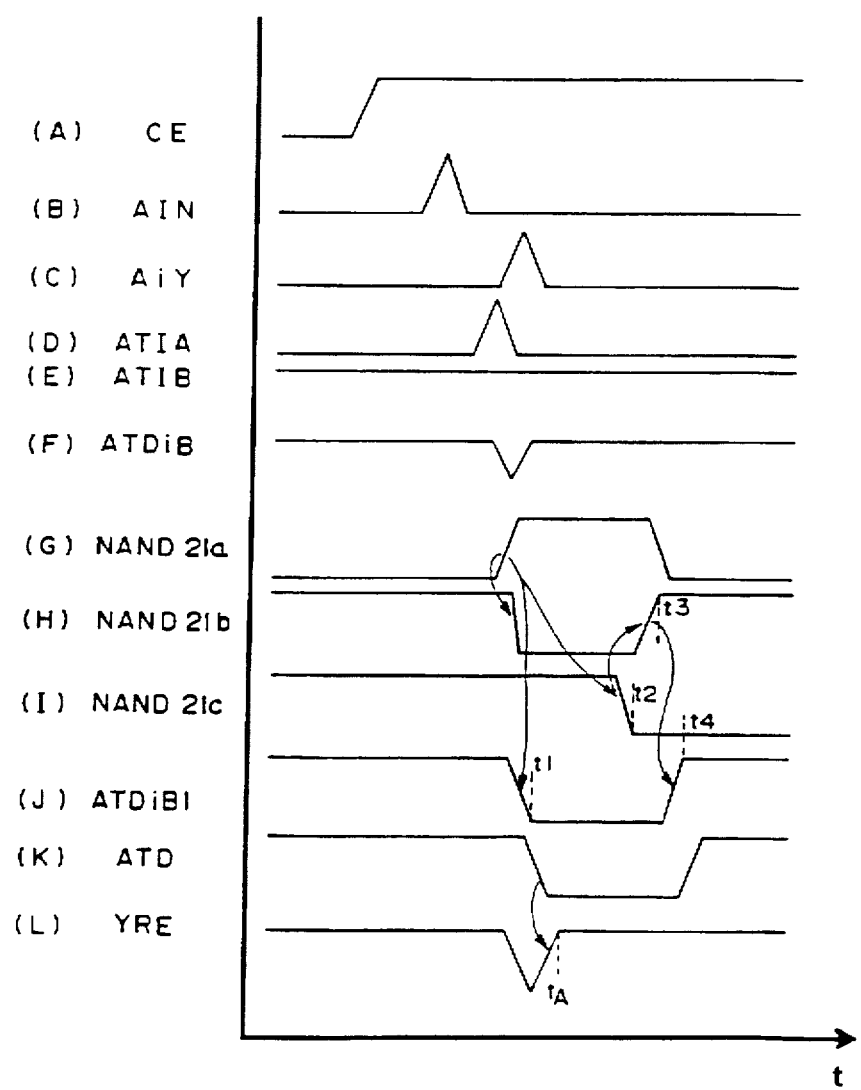
Figure 10:
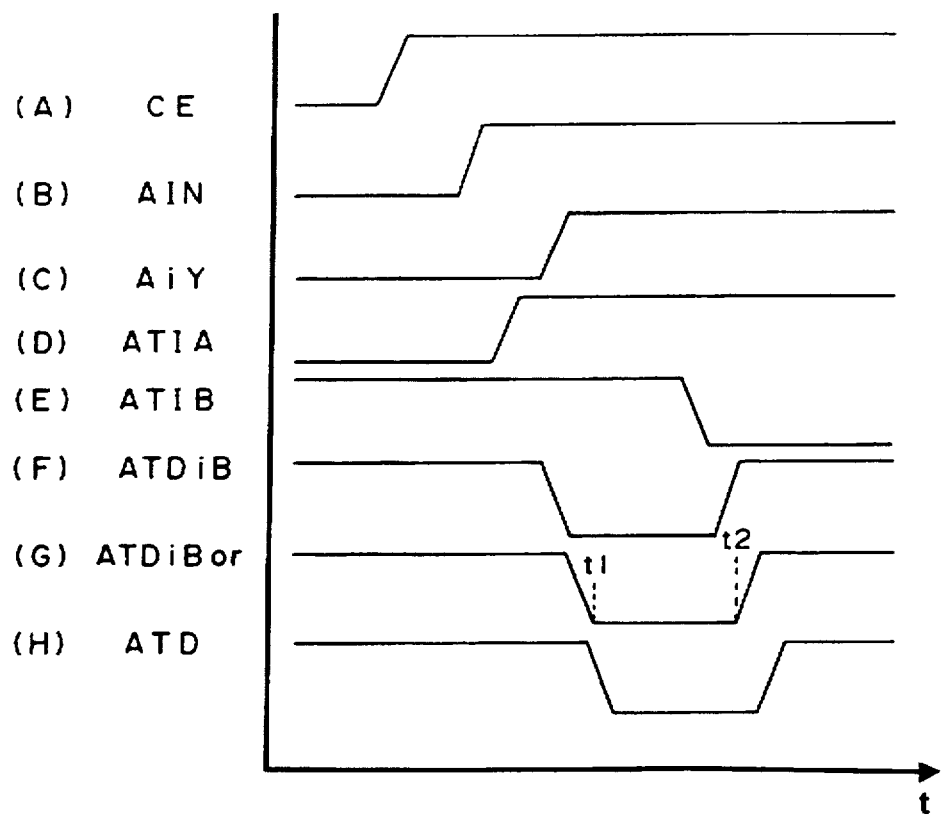
Figure 11:
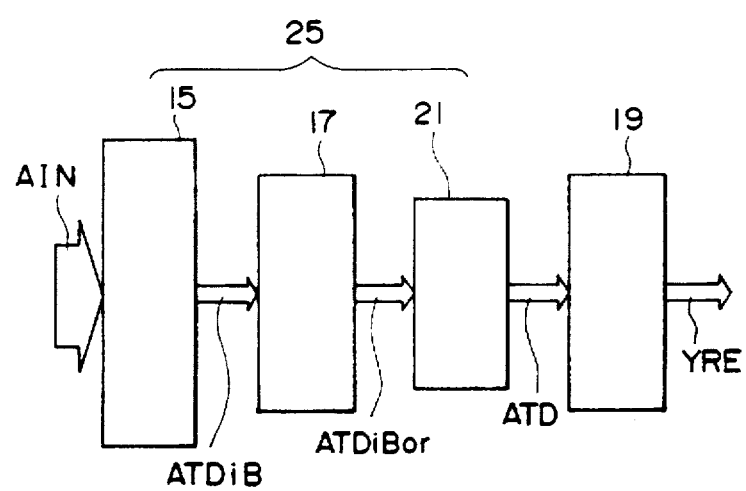
Figure 12:
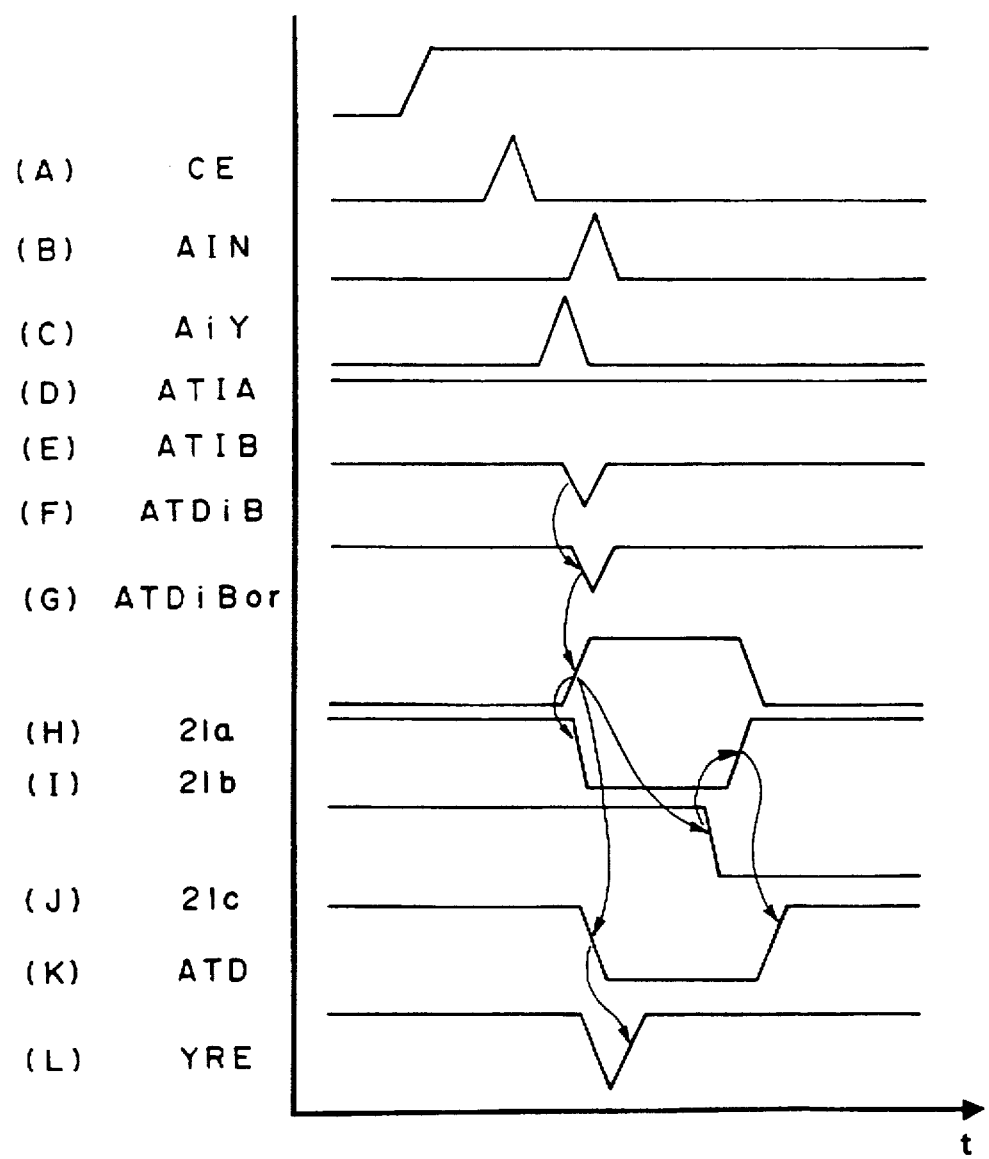
Figure 13:
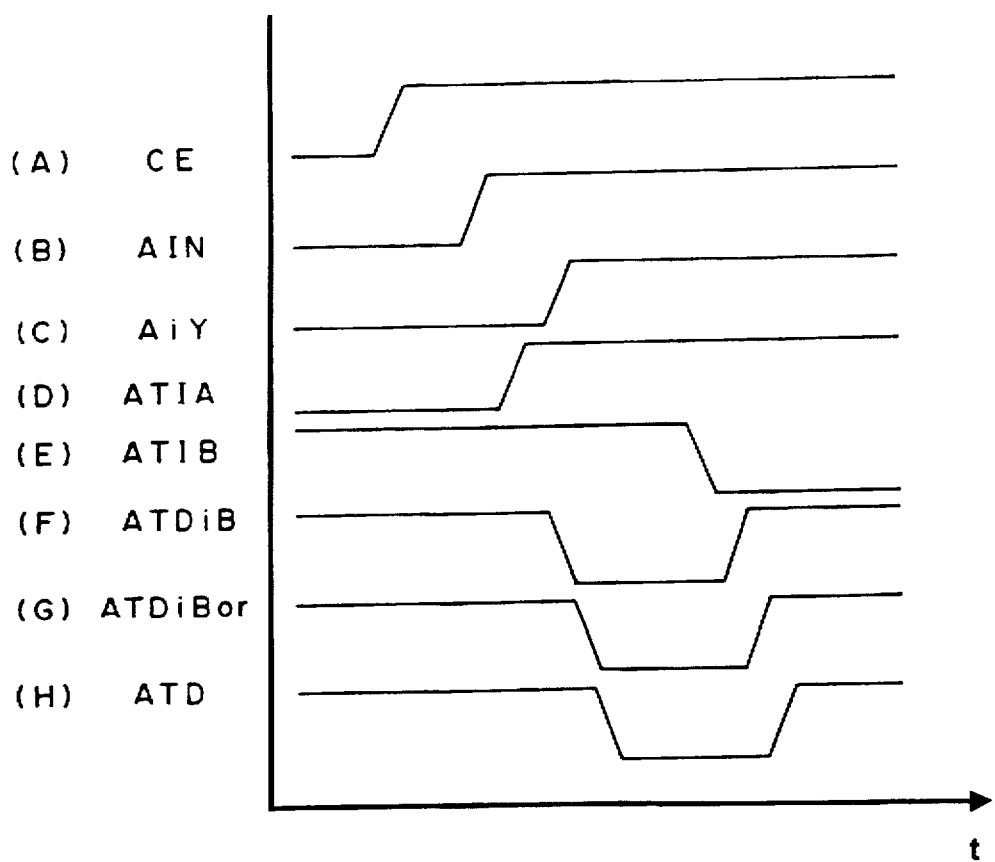

FIG. 8 is a timing chart for describing the operation of the ATD circuit shown in FIG. 6 to which noise is provided;

FIG. 9 is a timing chart for describing the operation of the ATD circuit shown in FIG. 1 to which noise is provided;

FIG. 10 is a timing chart for describing the operation of the ATD circuit shown in FIG. 1 to which a normal signal is provided;

FIG. 11 is a block diagram showing an ATD circuit according to a second embodiment of the present invention;

FIG. 12 is a timing chart for explaining the operation of the ATD circuit shown in FIG. 11 to which noise is provided; and FIG. 13 is a timing chart for explaining the operation of the ATD circuit shown in FIG. 11 to which a normal signal is provided.

DETAILED DESCRIPTION OF THE PREFERRED EMBODIMENTS

Preferred embodiments of the present invention will hereinafter be described with reference to the accompanying drawings. The drawings schematically show the present invention to the extent that it is possible to understand the same. Further, elements of structures similar to one another, which are shown in the respective drawings used for illustration, are identified by like reference numerals and the description of certain common elements will therefore be omitted.

FIG. 1 is a block diagram of an ATD circuit 23 showing a first embodiment of the present invention. A redundancy detecting circuit 19 is an example of a circuit which makes use of an ATD signal.

Figure 2:
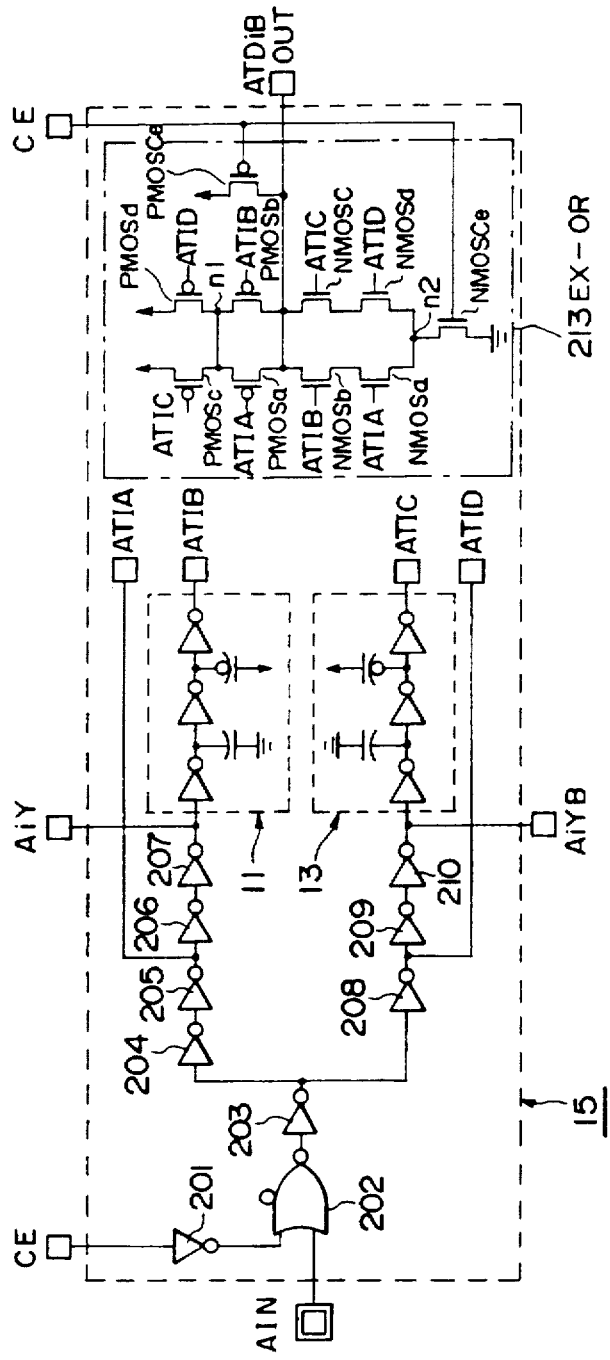
FIG. 2 is a diagram showing an address buffer circuit.

A) An address buffer circuit 15 is shown in FIG. 2 as a specific example of a first circuit means 15. The address buffer circuit 15 includes a first delay circuit 11 and a second delay circuit 13. Further, the address buffer circuit 15 has a plurality of inverters, a plurality of PMOSFETs, a plurality of NMOSFETs, a NOR circuit 202, and an EX-OR circuit 213, and the like.

The address buffer circuit 15 is provided in plural form within the ATD circuit so as to correspond to the number of bits of external address data.

The address buffer circuit 15 generates a signal ATDiB having a level which changes from an H level to an L level in response to a change of an external address signal AIN from an L level to an H level and which is reset to an H level after the elapse of a predetermined time, which is established by the delay circuits 11 and 13.

Figure 3:
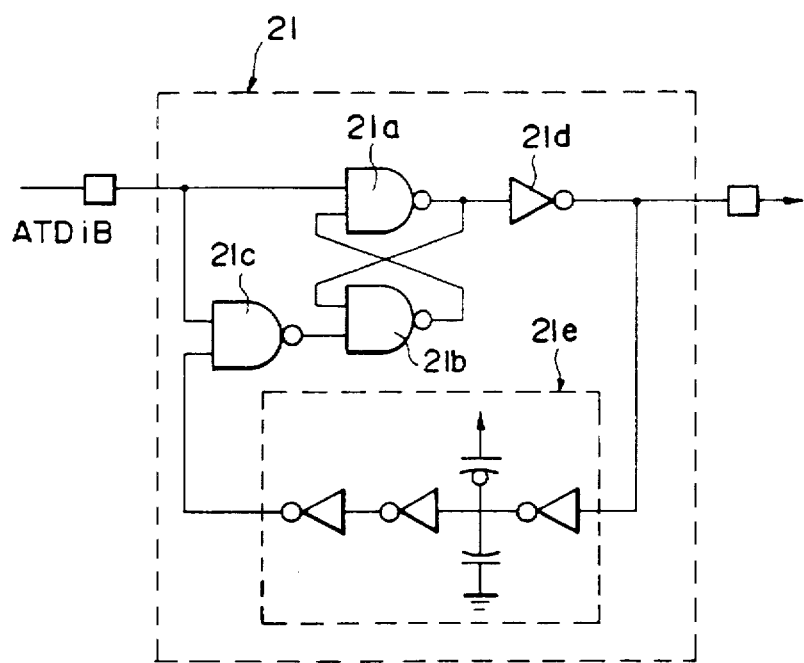
FIG. 3 is a diagram illustrating a pulse width amplifier circuit.

B) A pulse width amplifier circuit 21 will next be described. As shown in FIG. 3, the pulse width amplifier circuit 21 comprises first through third NAND circuits 21a through 21c, an inverter 21d, and a delay circuit 21e.

The output of the first circuit means 15 is electrically connected to a first input terminal of the first NAND circuit 21a, whereas the output of the second NAND circuit 21b is electrically connected to a second input terminal of the first NAND circuit 21a. The output of the first NAND circuit 21a is electrically connected to a first input terminal of the second NAND circuit 21b, whereas the output of the third NAND circuit 21c is electrically connected to a second input terminal of the second NAND circuit 21b. Further, the output of the first circuit means 15 is electrically connected to a first input terminal of the third NAND circuit 21c, whereas the output of the delay circuit 21e is electrically connected to a second input terminal of the third NAND circuit 21c.

The inverter 21d is electrically connected between the output of the first NAND circuit 21a and an output terminal of the pulse width amplifier circuit 21.

The delay circuit 21e is electrically connected between the output of the inverter 21d and the third NAND circuit 21c. Further, the delay circuit 21e delays a signal provided by the inverter 21d by a predetermined time and provides the delayed signal to the second input terminal of the third NAND circuit 21c. The delay time provided by the delay circuit 21e is set according to a desired pulse width of the ATD signal. In the present embodiment, the delay time is set so as to become substantially equal to delay times the delay circuits 11 and 13 which have been incorporated into the first circuit means 15.

Figure 4:
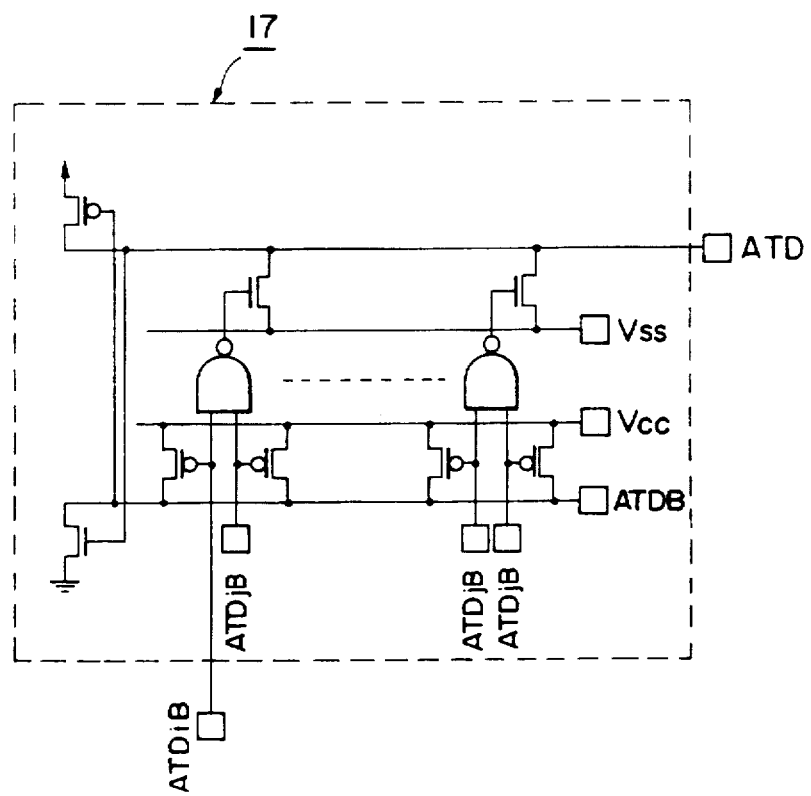
FIG. 4 is a diagram depicting an OR circuit.

C) An OR circuit 17 is shown in FIG. 4 as a specific example of a second circuit means. The OR circuit 17 comprises a plurality of NAND circuits, a plurality of PMOSFETs and a plurality of NMOSFETs, and the like.

The number of the OR circuits is suitably set according to the design thereof.

Further, the OR circuit 17 waveform-shapes an ATDiB1 signal provided by the pulse width amplifier circuit 21 so as to provide an ATD signal therefrom.

Figure 5:
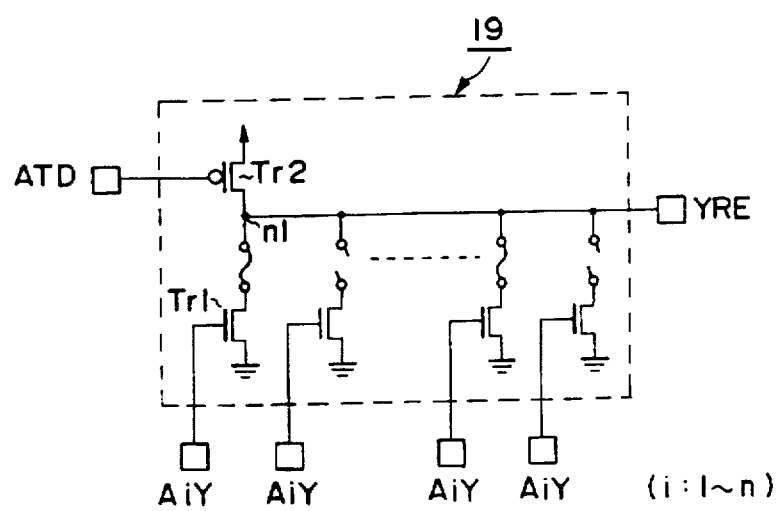
FIG. 5 is a diagram showing a redundancy detecting circuit.

D) The redundancy detecting circuit 19 will next be described. As shown in FIG. 5, the redundancy detecting circuit 19 has a PMOSFET (Tr2) electrically connected to a source potential and a node n1 and having a gate supplied with an ATD signal. Further, the redundancy detecting circuit 19 has fuses and NMOSFETs (Tr1) electrically series-connected between the node n1 and a ground potential. An internal address signal AiY is provided to the gate of each Tr1.

The operation of the ATD circuit (see FIG. 1) according to the first embodiment of the present invention will be described below. However, the operation of an ATD circuit (see FIG. 6) excluding the pulse width amplifier circuit 21 shown in FIG. 3 will first be described to show the importance of the pulse width amplifier circuit 21 (see FIG. 3) employed in the first embodiment.

FIG. 6 is a block diagram of the ATD circuit shown for comparison.

The address buffer circuit shown in FIG. 2, the OR circuit shown in FIG. 4, and the circuit shown in FIG. 5 are respectively used as a first circuit means 15, a second circuit means 17, and a redundancy detecting circuit 19 of the ATD circuit shown in FIG. 6.

The operation of the ATD circuit will be explained with reference to a timing chart shown in FIG. 7.

When an external address signal AIN changes from an L level to an H level (see FIG. 7B) in a state in which an activation signal CE is of an H level (see FIG. 7A), the output of the NOR circuit 202 shown in FIG. 2 is brought to an L level. The L level signal is inverted by the five inverters 203 through 207 so as to be brought into an internal address signal AiY of an H level (see FIG. 7C). Further, the L level signal is inverted by the three inverters 203 through 205 so as to drive an ATIA signal to an H level (see FIG. 7D). Furthermore, the L level signal is inverted and delayed by the five inverters 203 through 207 and the delay circuit 11 so as to produce an ATIB signal (see FIG. 7E).

Still further, the L level signal at the NOR circuit 202 output provides an internal address signal AiYB of an L level (see FIG. 7F) via the four inverters 203 and 208 through 210. The AiYB signal corresponds to a signal obtained by inverting the AiY signal. Still further, the L level signal provide an ATID signal of an L level through the two inverters 203 and 208 (see FIG. 7H). Still further, the L level signal is inverted and delayed by the four inverters 203 and 208 through 210 and the delay circuit 13 so as to drive an ATIC signal of an H level (see FIG. 7G).

The ATIA through ATID signals and the CE signal are applied to a plurality of transistors which constitute the EX-OR circuit 213.

The ATIC and ATID signals are respectively applied to the gates of a PMOSc and a PMOSd parallel-connected between a source potential and a node n1. The ATIA and ATIB signals are respectively applied to the gates of a PMOSa and a PMOSb parallel-connected between the node n1 and an output terminal OUT. The ATIB and ATIA signals are supplied to the gates of an NMOSb and an NMOSa series-connected between the output terminal OUT and a node n2. The ATIC and ATID signals are applied to the gates of an NMOSc and an NMOSd series-connected between the output terminal OUT and the node n2.

Further, a PMOSce electrically connected between the source potential and the output terminal OUT and an NMOSce electrically connected between a ground potential and the node n2 are respectively supplied with the CE signal to the respective gates.

1) Since the PMOSc and PMOSa of the EX-OR circuit 213 are switched into an on state during periods in which the ATIA=L, ATIB=H, ATIC=L, and ATID=H, the ATDiB signal is driven to an H level. 2) During periods in which the ATIA=H, ATIB=H, ATIC=L, and ATID=L, the NMOSb and NMOSa of the EX-OR circuit 213 are turned on. Since the high-level CE signal is applied to the NMOSce, the NMOSce is in an on state. Accordingly, the ATDiB signal is at an L level. 3) Since the PMOSd and PMOSb of the EX-OR circuit 213 are held on during periods in which the ATIA=H, ATIB=L, ATIC=H, and ATID=L, the ATDiB signal is driven H in level. Thus, the ATDiB signal becomes a pulse signal having a predetermined pulse width, having a level which changes from H to L to H (see FIG. 7I).

Further, the ATD signal becomes a signal having a pulse width corresponding to the pulse width of the ATDiB signal (see FIG. 7J).

A description has been made of the case where the AIN signal has changed from an L level to an H level. However, the same operation as described above is performed even in the case where the AIN signal changes from an H to an L level.

However, when noise is produced in the external address signal AIN, the ATD signal does not become a pulse signal having a predetermined width. As a result, the output of the redundancy detecting circuit 19 remains at an L level without being reset to an H level.

The above operation will be described in detail with reference to a timing chart shown in FIG. 8.

When noise (represented by to a sawtooth signal) having a level which instantaneously changes from L to H and H to L, is developed in an external address signal AIN (see FIG. 8B) in a state in which an activation signal CE is in an H level (see FIG. 8A), AiY and ATIA signals are both represented in the form of sawtooth waveforms. Further, the peak of each sawtooth waveform is attenuated to a level that is lower than the peak of the noise (see FIGS. 8C and 8D).

While the sawtooth signal is processed in generating an ATIB signal by the first delay circuit 11, the sawtooth signal is further attenuated by the first delay circuit 11. Accordingly, the ATIB signal remains at an H level (see FIG. 8E).

Since the ATIC and ATID signals are substantially inverted versions of the ATIB and ATIA signals, as shown in FIG. 9, their timing will be omitted from FIG. 8.

Accordingly, an ATDiB signal becomes an L level at the time when the ATIA signal reaches an H level (see FIG. 8F). At this time, the ATIB, ATIC, and ATID have levels of H, L and L respectively.

Thus, it cannot be ensured that the ATDiB signal will have a pulse width corresponding to the delay time of the first delay circuit 11.

Accordingly, an ATD signal generated by the OR circuit 17 corresponding to the second circuit means is not certain to have a pulse width associated with the delay time of the first delay circuit 11 either (see FIG. 8G).

A description will next be made of the case where such an ATD signal is provided to the redundancy detecting circuit 19.

A YRE signal corresponding to the output of the redundancy detecting circuit (see FIG. 5) is first maintained at an H level indicative of an initial level (corresponding to an interval I shown in FIG. 8H).

However, if the AiY signal changes from an L level to an H level and exceeds a threshold value of each Tr1 in the redundancy detecting circuit 19, then the YRE signal changes from an H level to an L level (see a time tA in FIG. 8H).

When the ATD signal is a normal signal having a predetermined pulse width, the YRE signal is reset to the H level in response to the ATD signal (see a indicated by a dotted line in FIG. 8H). However, when the ATD signal is a sawtooth signal having a short L level period, the YRE signal cannot be reset to the H level, so that an incorrect decision is made upon the subsequent redundancy determination.

The operation of the ATD circuit according to the first embodiment of the present invention, which has been described with reference to FIG. 1, will next be described in detail with reference to a timing chart shown in FIG. 9.

Since FIGS. 9A through 9F are identical in timing to FIGS. 8A through 8F, their description will be omitted. As shown in FIG. 9F, a pulse width associated with the delay time of the first delay circuit 11 cannot be ensured. Thus, a description will be made of the case where a sawtooth ATDiB signal is generated by the first circuit means (address buffer circuit) 15 and provided to the pulse width amplifier circuit 21 shown in FIG. 3.

The outputs of the NAND circuits 21a, 21b and 21c of the pulse width amplifier circuit 21 are respectively maintained at L, H, and L levels. When the ATDiB signal exceeds a threshold value of the NAND circuit 21a, the NAND circuit 21a output is at an H level and the NAND circuit 21b output is at an L level (see FIGS. 9G and 9H). Further, the output of the NAND circuit 21a is inverted by the inverter 21d. As a result, an ATDiBI signal is at an L level (at a time t1 in FIG. 9J). Since the output of the inverter 21d is provided to the delay circuit 21e, the L level signal (corresponding to the signal output from the delay circuit 21d) is delayed by the delay circuit 21e so that the output of the NAND circuit 21c changes from an H level to an L level (at a time t2 in FIG. 9I). The L level signal is provided from the NAND circuit 21c to the NAND circuit 21b so as to clear or open up the latch of the NAND circuits 21a and 21b. Namely, the ATDiBI signal changes from an L level to an H level (at a time t4 in FIG. 9J) in response to a change of the output of the NAND circuit 21b from the H level to a L level (at a time t3 in FIG. 9H). A period during which the ATDiBI signal is at the L level, corresponds to the delay time of the delay circuit 21e. This delay time is substantially equal to the delay times of the delay circuits 11 and 13 of the first circuit means (address buffer circuit) 15.

By using the pulse width amplifier circuit 21 in this way, an ATDiBI signal (see FIG. 9K) having a desired pulse width can be obtained even if the external address signal AIN becomes a sawtooth signal.

Further, the ATDiBI signal is waveform-shaped by the second circuit means (OR circuit) 17 so as to be provided as an ATD signal therefrom (see FIG. 9K).

Thus, since the ATD signal is L in level during a predetermined period even if the ATD signal is provided to a redundancy detecting circuit shown in FIG. 11, the ATD signal can activate the Tr2 in FIG. 5. Therefore, a potential is supplied to the Tr2 from the source potential so that a YRE signal is reset to an H level (at a time tA in FIG. 9L).

Thus, an accurate redundant decision can be made.

A description will next be made of the case where a normal external address signal is received as shown in FIG. 10B.

Since FIGS. 10A through 10F are identical in timing to FIGS. 7A through 7E and FIG. 7I, their description will be omitted.

A description will be made of the case where an ATDiB signal having a predetermined pulse width is generated by the first circuit means (address buffer circuit) 15 as shown in FIG. 10F and provided to the pulse width amplifier circuit 21 shown in FIG. 3.

In response to a change of the ATDiB signal from an H level to an L level, an ATDiBIsignal also changes from an H to an L levels. After the ATDiBI signal has been maintained at an L level during a period corresponding to the delay time of the delay circuit 21e of the pulse width amplifier circuit 21, the ATDiBI signal is brought to an H level. Since detailed operations of the pulse width amplifier circuit are similar to those described in FIG. 3 in this case, their description will be omitted.

As has been apparent from the above description, the pulse width amplifier circuit has the effect of prohibiting the supply of the signal to the redundancy detecting circuit 19 when the ATDiB signal is attenuated to the extent to which it cannot exceed the threshold value of the NAND circuit 21a.

FIG. 11 is a block diagram of an ATD circuit showing a second embodiment of the present invention.

In the first embodiment (see FIG. 1), the pulse width amplifier circuit 21 is provided between the first circuit means 15 and the second circuit means 17. In the second embodiment, however, a pulse width amplifier circuit 21 is connected to the output of a second circuit means 17.

Thus, a signal ATBiBor generated by the second circuit means 17 is provided to one input terminal of the NAND circuits 21a and 21c of the pulse amplifier circuit (see FIG. 3).

Since the pulse width amplifier circuit is electrically connected to the first circuit means in a correspondence of 1:1 in the first embodiment, the pulse width amplifier circuit is requires a number of input bits identical to the number of bits of the external address data.

Since, however, the pulse width amplifier circuit is electrically connected to the output of the second circuit means in a correspondence of 1:1 in the second embodiment, the pulse width amplifier circuit can be greatly reduced in number.

It is therefore possible to reduce a circuit area of the pulse width amplifier circuit.

The ATD circuit according to the second embodiment is basically identical in operation to the first embodiment.

In the first embodiment, the ATDiB signal generated by the first circuit means is provided to the pulse width amplifier circuit 21, whereas in the second embodiment, the ATDiBor electrically processed by the second circuit means (OR circuit) is provided to the pulse width amplifier circuit 21 in place of the ATDiB signal.

When noise is produced in an external address signal so that the signal becomes a sawtooth signal, the ATDiBor signal becomes a sawtooth signal as shown in FIGS. 12G and 13G. When the external address signal normally changes from an L level to an H level, the ATDiBor signal is shaped as a signal having a desired pulse width (in a manner similar to the ATDiB shown in FIG. 9F and FIG. 10F).

Thus, the ATD circuit according to the second embodiment performs an operation similar to the operations described using FIGS. 9 and 10.

According to the present invention, as has been described above in detail, since the ATD signal having the desired pulse width can be generated even if the noise is produced in the external address signal, so that the external address signal becomes a sawtooth signal, the redundancy detecting circuit or the like supplied with the ATD signal can be accurately activated.

Thus, a stable ATD pulse can be generated by installing the ATD circuit of the present invention in a semiconductor memory device such as a SRAM, a DRAM, or the like.

Figure 7:
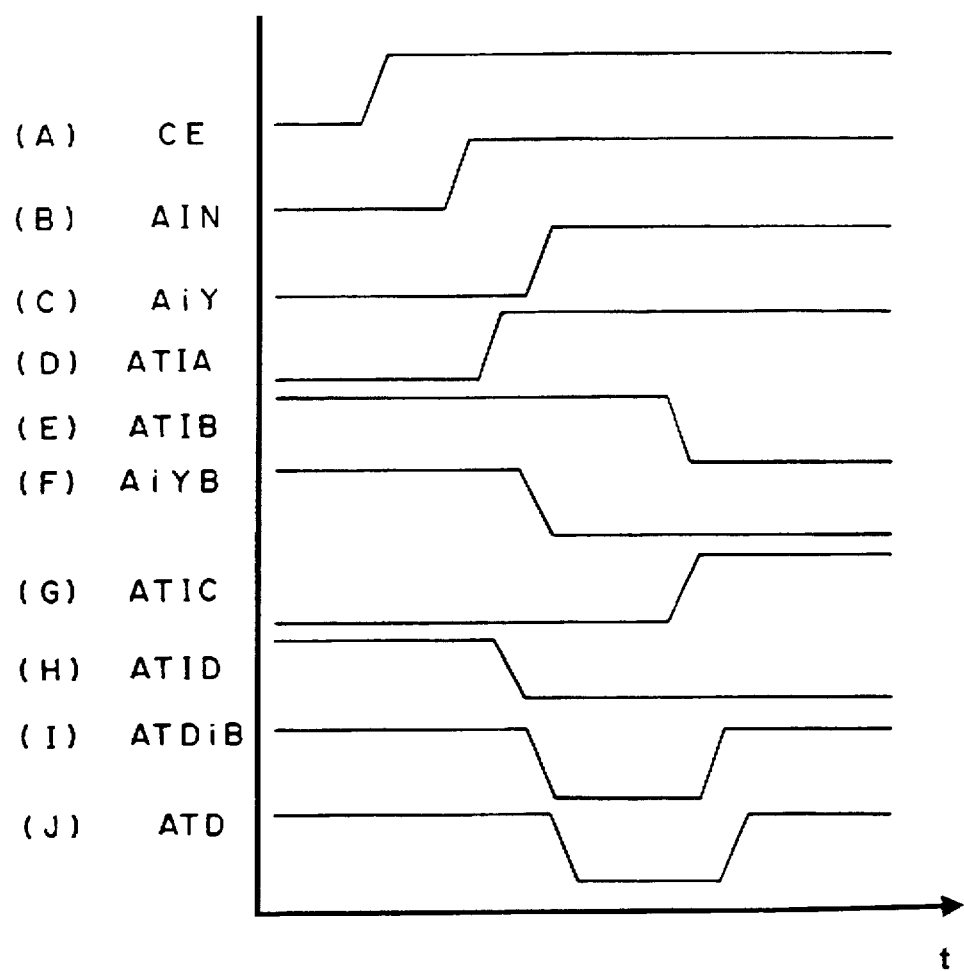
FIG. 7 is a timing chart for describing the operation of the ATD circuit shown in FIG. 6 to which a normal signal is provided.

In the present invention, the first and second circuit means are not necessarily limited to or by the address buffer circuit show in FIG. 7 and the OR circuit shown in FIG. 2, respectively.

Further, the pulse width amplifier circuit is not limited to the functional operation illustrated in FIG. 8 either. Any one may be used if a function similar to the above is provided.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. An ATD circuit, comprising:
   (a) first circuit means for generating a first output signal having a first pulse width, in response to a change in an external address signal and generating, when the external address signal includes a first sawtooth signal, a second sawtooth output signal having a peak value smaller than a peak value of the first sawtooth signal;
   (b) a pulse width amplifier circuit for amplifying the first pulse width or a pulse width of the second sawtooth output signal generated by said first circuit means, said pulse width amplifier circuit generating a third output signal having a second pulse width corresponding to the first pulse width when the first output signal is provided thereto, and generating a fourth output signal having a third pulse width when the second sawtooth output signal is provided thereto; and
   (c) second circuit means for receiving the third output signal or the fourth output signal generated by said pulse width amplifier circuit and waveform-shaping the third output signal or the fourth output signal so as to generate an ATD signal therefrom.

2. An ATD circuit according to claim 1, wherein said first, second, and third pulse widths are set so as to be substantially equal to each other.

3. An ATD circuit according to claim 1, wherein said first circuit means includes
   a NOR circuit activated in response to a CE signal so as to provide a NOR signal obtained by inverting an AIN signal received thereby;
   an odd number of inverters connected between the output of said NOR circuit and a first terminal so as to provide a first terminal signal obtained by inverting said NOR signal to the first terminal;
   an even number of inverters connected between the output of said NOR circuit and a second terminal so as to provide a second terminal signal identical in level to said NOR signal to the second terminal;
   a first delay circuit connected between the first terminal and a third terminal;
   a second delay circuit connected between the second terminal and a fourth terminal; and
   an EX-OR circuit including
   first and second PMOS transistors parallel-connected between a source potential and a first node and having gates respectively connected to the fourth and second terminals;
   third and fourth PMOS transistors parallel-connected between the first node and an output terminal and having gates respectively connected to the first and third terminals;
   first and second NMOS transistors series-connected between the output terminal and a second node and having gates respectively connected to the third and first terminals;
   third and fourth NMOS transistors series-connected between the output terminal and the second node and having gates respectively connected to the fourth and second terminals;
   a fifth NMOS transistor connected between the second node and a ground potential and driven in response to the CE signal; and
   a fifth PMOS transistor connected between the output terminal and the source potential and driven in response to the CE signal.

4. An ATD circuit according to claim 1, wherein said pulse width amplifier circuit includes
   an input terminal;
   first and second NAND circuits each having first inputs connected to said input terminal;
   a third NAND circuit having first and second inputs respectively connected to outputs of said first and second NAND circuits and having an output connected to a second input of said first NAND circuit; and
   a delay circuit connected between the output of said first NAND circuit and a second input of said second NAND circuit.

5. An ATD circuit comprising:
   (a) first circuit means for generating a first output signal in response to a chance in an external address signal from a first level to a second level, wherein the first output signal has a first pulse width and wherein, when the external address signal includes a first sawtooth signal, the first output signal includes a second sawtooth signal having a peak value smaller than a peak value of the first sawtooth signal;

(b) second circuit means for receiving the first output signal and waveform-shaping the first output signal, said second circuit means generating a second output signal, wherein the second output signal has a second pulse width corresponding to the first pulse width and includes a third sawtooth signal corresponding to the second sawtooth signal when the second sawtooth signal is provided thereto; and (c) a pulse width amplifier circuit for amplifying a pulse width of the second output signal, said pulse width amplifier circuit generating an ATD signal having a third pulse width corresponding to the second pulse width when the third sawtooth signal is not provided thereto and generating the ATD signal having a fourth pulse width when the third sawtooth signal is provided thereto;

wherein said pulse width amplifier circuit includes at least one NAND circuit for receiving the second output signal and prohibiting generation of the ATD signal when a level of the second output signal is below an input threshold value of the NAND circuit.

6. An ATD circuit, comprising:

(a) a first circuit for generating a first output signal in response to a change in an external address signal, wherein the first output signal has a first pulse width, and wherein, when the external address signal includes a first sawtooth signal, the first output signal includes a second sawtooth signal having a peak value smaller than a peak value of the first sawtooth signal;

(b) a pulse width amplifier circuit for generating a third output signal having a second pulse width corresponding to the first pulse width when the second sawtooth signal is not provided thereto, and for generating a fourth output signal having a third pulse width when the second sawtooth signal is provided thereto; and (c) second circuit means for receiving the third output signal or the fourth output signal generated by said pulse width amplifier circuit and waveform-shaping the third output signal or the fourth output signal so as to generate an ATD signal therefrom.

7. An ATD circuit according to claim 6, wherein said first, second, and third pulse widths are set so as to be substantially equal to each other.

8. An ATD circuit according to claim 6, wherein said first circuit means includes a NOR circuit activated in response to a CE signal so as to provide a NOR signal obtained by inverting an AIN signal received thereby;

an odd number of inverters connected between the output of said NOR circuit and a first terminal so as to provide a first terminal signal obtained by inverting said NOR signal to the first terminal;

an even number of inverters connected between the output of said NOR circuit and a second terminal so as to provide to the second terminal a second terminal signal identical in level to said NOR signal;

a first delay circuit connected between the first terminal and a third terminal;

a second delay circuit connected between the second terminal and a fourth terminal; and first and second PMOS transistors parallel-connected between a source potential and a first node and having gates respectively connected to the fourth and second terminals;

third and fourth PMOS transistors parallel-connected between the first node and an output terminal and having gates respectively connected to the first and third terminals;

first and second NMOS transistors series-connected between the output terminal and a second node and having gates respectively connected to the third and first terminals;

third and fourth NMOS transistors series-connected between the output terminal and the second node and having gates respectively connected to the fourth and second terminals;

a fifth NMOS transistor connected between the second node and a ground potential and driven in response to the CE signal; and a fifth PMOS transistor connected between the output terminal and the source potential and driven in response to the CE signal.

9. An ATD circuit according to claim 6, wherein said pulse width amplifier circuit includes an input terminal;

first and second NAND circuits each having first inputs connected to said input terminal;

a third NAND circuit having first and second inputs respectively connected to outputs of said first and second NAND circuits and having an output connected to a second input of said first NAND circuit; and a delay circuit connected between the output of said first NAND circuit and a second input of said second NAND circuit.

* * * * *